United States Patent [19]
Ohkubo et al.

[11] Patent Number: 5,444,000
[45] Date of Patent: Aug. 22, 1995

[54] METHOD OF FABRICATING INTEGRATED CIRCUIT WITH IMPROVED YIELD RATE

[75] Inventors: Norio Ohkubo, Machida; Makoto Suzuki, Niiza, both of Japan; Katsuro Sasaki, Burlingame, Calif.; Yoshio Homma, Tokyo, Japan

[73] Assignee: Hitachi, Ltd., Tokyo, Japan

[21] Appl. No.: 205,159

[22] Filed: Mar. 3, 1994

[30] Foreign Application Priority Data

Mar. 5, 1993 [JP] Japan ................................ 5-044876
Sep. 7, 1993 [JP] Japan ................................ 5-221697

[51] Int. Cl.⁶ ...................... H01L 21/66; G01R 31/26
[52] U.S. Cl. ........................................ 437/8; 437/51; 437/923
[58] Field of Search ................ 437/923, 8, 51

[56] References Cited

U.S. PATENT DOCUMENTS 4,415,606 11/1983 Cynkar et al. ................ 437/923
5,139,963 8/1992 Suzuki ................................ 437/923

FOREIGN PATENT DOCUMENTS 58-157150A 9/1983 Japan ................................ 437/923

OTHER PUBLICATIONS

Wolf, Silicon processing for the VLSI ERA vol. 2 pp. 189–199 and 244–251.

*Primary Examiner*—Olik Chaudhuri
*Assistant Examiner*—H. Jey Tsai
*Attorney, Agent, or Firm*—Antonelli, Terry, Stout & Kraus

[57] ABSTRACT

A method of fabricating semiconductor integrated circuits with an improved yield rate is realized, which requires no special circuits for selecting normal circuit blocks. Removable temporary wires are connected to circuit blocks, which are thus tested. After removing the temporary wires, a plurality of normally-operating circuit blocks are interconnected by new main wires. The need of a special selecting circuit for replacing defective circuit blocks with normal circuit blocks is eliminated without increasing the delay time due to redundancy. The freedom of the main wiring formed after removal of the temporary wires is so high that the functional freedom of the system constructed is improved.

25 Claims, 14 Drawing Sheets

(a) STAGE 1

(b) STAGE 2

(a) STAGE 1

(b) STAGE 2

FIG.6A
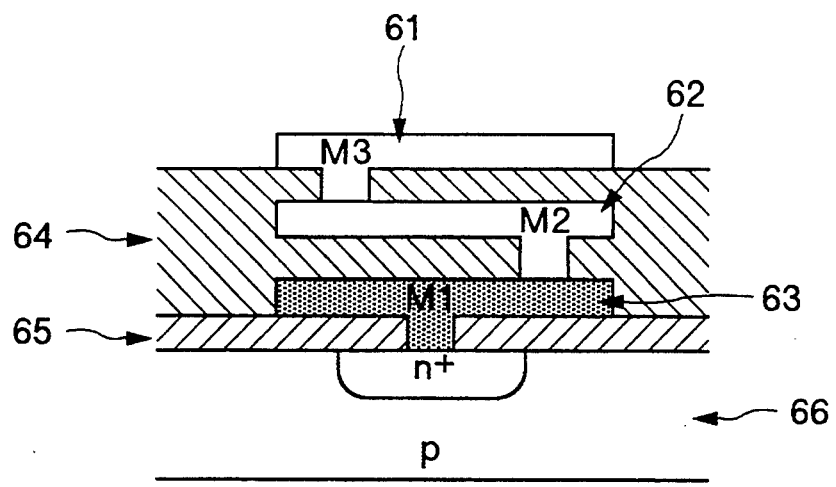
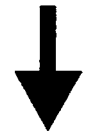
FIG.6B
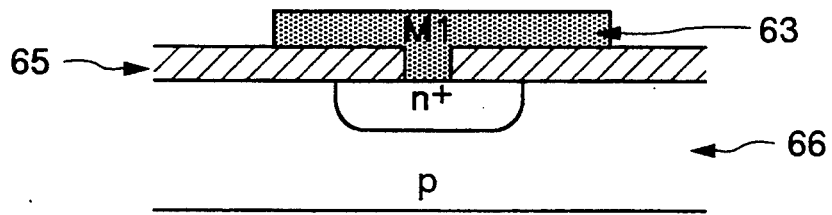

FIG.7A
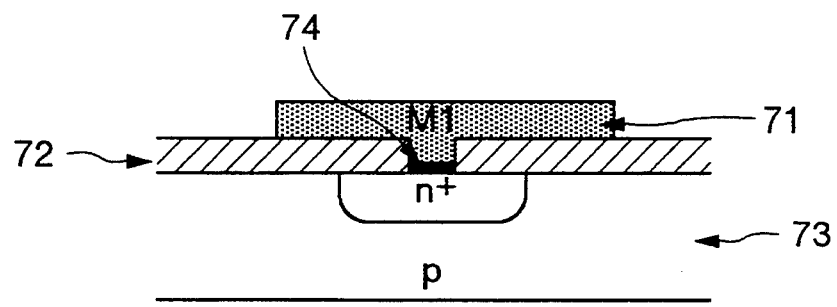
FIG.7B
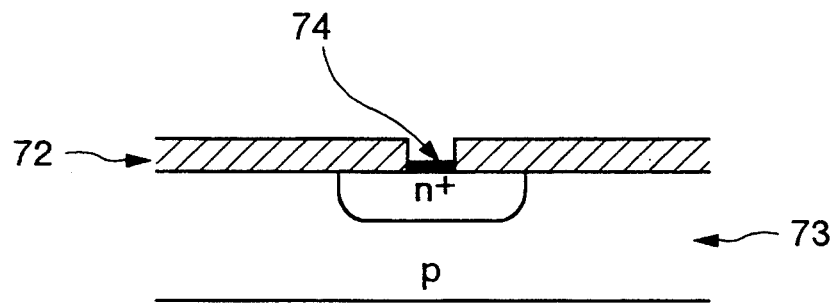

(a) STAGE 1

*: NOT SELECTED (B) STAGE 2

(a) STAGE 1

(B) STAGE 2

(a) STAGE 1

(b) STAGE 2

METHOD OF FABRICATING INTEGRATED CIRCUIT WITH IMPROVED YIELD RATE

BACKGROUND OF THE INVENTION AND SUMMARY OF THE INVENTION

The present invention relates to a method of fabricating integrated circuits, or more in particular to a method of fabricating integrated circuits in which the yield rate of the integrated circuits is improved by replacing a defective block with a spare block.

As a method of improving the yield rate of the integrated circuits, the redundancy method using fuse means for a semiconductor storage unit is well known. In this redundancy method, a normal memory cell and a spare memory cell are built on the same chip. In the case where a defect occurs in the normal memory cell, the function is saved by replacing the normal memory cell with the spare memory cell. The replacement of the normal memory cell with the spare memory cell is effected by blowing out the fuse and thus switching a decoder circuit activated thereby.

A redundancy method using the above-mentioned fuse means is disclosed, for example, in JP-A-1-98198.

On the other hand, JP-A-57-35342 discloses a method of fabricating large-scale integrated circuits in which the electric characteristics of a plurality of functional blocks are inspected by connecting functional blocks and interactive wires by connective wires. After that, only the connective wires of the functional blocks having unsatisfactory characteristics are eliminated, thereby constructing the desired system function by functional blocks with satisfactory characteristics.

In the microprocessor, the gate arrays, ASICLSI, etc., it is feared that the yield rate decreases considerably with the increased integration using the microprocessing technique. However, the problem is that the redundancy method using the above-mentioned fuse means is inapplicable to the integrated circuits other than the semiconductor storage devices. This fact is described below.

Integrated circuits other than the semiconductor storage devices have no circuit for selecting repeated blocks such as a decoder circuit which selects a memory cell of the semiconductor storage device in the presence of the repeat of same blocks. As a result, even when the repeated blocks have a spare block, a circuit for selecting repeated blocks is necessary to eliminate defective blocks and replace them with normally-operating blocks. The result is an increased circuit scale. Also, individual switching circuits are difficult to include due to the great variety of blocks.

The speed of IC is greatly reduced by increasing propagation delay due to switching blocks.

The method of fabricating large-scale integrated circuits disclosed in JP-A-57-35342, on the other hand, poses the defect that the constructed system function is restricted in spite of the fact that functional blocks having defective characteristics are separated to build the desired system.

Accordingly, it is an object of the present invention to provide a method of fabricating integrated circuits in which defective blocks are replaced by satisfactory blocks without any block-selecting circuit, and the yield rate of the integrated circuits is improved while at the same time improving the freedom of the functions of a built-up system.

In order to achieve the above-mentioned objects, a representative embodiment of the invention represents a method of fabricating integrated circuits, comprising a first stage for testing a plurality of circuit blocks by connecting a plurality of circuit blocks of a first conductor wire (hereinafter referred to as the temporary wire) and discriminating normal circuit blocks from the defective blocks, a second stage for removing the first wire (temporary wire), and for forming a second wire (hereinafter referred to as the main wire) (see FIG. 1) connecting the normal blocks to each other.

A preferred embodiment of the invention further shows the detail of a method of fabricating integrated circuits, wherein semiconductor devices (N+, P) making up a plurality of circuit blocks before the first stage are formed in a semiconductor substrate (66), after which an insulating surface protection film (65) having a via on the semiconductor device is formed on the semiconductor device;

wherein prior to the first stage, an electrode (63) is connected to the semiconductor device (n+, P) through the via on the insulating surface protection film (65);

wherein an insulating film (64) having a via and made of a material different from the insulating surface protection film (65) is formed on the electrode and the insulating surface protection film (65) prior to the first step;

wherein the first conductor wire is connected to said electrode (63) through said via of the insulating film in the first stage; and wherein the insulating film (64) is removed before the second conductive wire is formed in the second stage (See FIG. 6).

A preferred embodiment of the invention shows a further detail of the method of fabricating integrated circuits, in which the material of the first wire is different from that of the electrode (63) of the semiconductor device (n+, P) (See FIG. 6).

The first wire (temporary wires 61, 62) removed in the process is preferably made of a wire without remainder (such as a conductive material mainly composed of aluminum, tungsten or copper, or high-purity aluminum not containing silicon). Also, the insulating film (64) for the temporary wires (61, 62) is preferably composed of a material (an insulating material having the impurities content of less than 100 ppm and a heat resistance of 200° C., such as polyimide) which does not damage the underlying insulating surface protection film (65) or the electrode (63) of the underlying semiconductor device in removing the insulating film (64) and the temporary wires (61, 62) (See FIG. 6).

According to the above-described process for fabricating integrated circuits, the conductor wire (temporary wire) connected for the block test can be removed. Therefore, in the case where a defective block is found, it can be removed for reconnection only with a satisfactory block.

As a result, the need of the circuit for selecting a block is eliminated and a defective block can be replaced with a conforming block, thereby providing completely satisfactory integrated circuits.

Also, since the wiring freedom of the second conductor wire (main wire) formed after removing the first conductor wire (temporary wire) is so large that the freedom of the functions of the system constructed is improved (See FIG. 1).

In a method of fabricating integrated circuits according to a preferred embodiment of the invention, the insulating surface protection film 65 and the insulating film 64 have different materials. In removing the insulating film 64 before forming the second conductor wire, therefore, the underlying insulating surface protection film 65 is rarely damaged (See FIG. 6).

In a method of fabricating integrated circuits according to a more preferred embodiment of the invention, the material 61, 62 of the first conductor wire is different from that of the electrode 63 of the semiconductor device. In removing the material 61, 62 of the first conductor wire as a temporary wire before forming the second conductor wire making up a main wire, therefore, the electrode 63 of the semiconductor device in the underlying block is seldom damaged (See FIG. 6).

BRIEF DESCRIPTION OF THE DRAWINGS

FIGS. 6A, 6B are sectional views showing the process for removing the temporary wires in a method of fabricating integrated circuits according to an embodiment of the invention.

FIGS. 7A, 7B are sectional views showing the processes for removing the temporary wires in the method of fabricating integrated circuits according to still another embodiment of the invention.

DESCRIPTION OF THE PREFERRED EMBODIMENTS

Embodiments of the invention will be described in more detail below with reference to the accompanying drawings.

Figure 1:
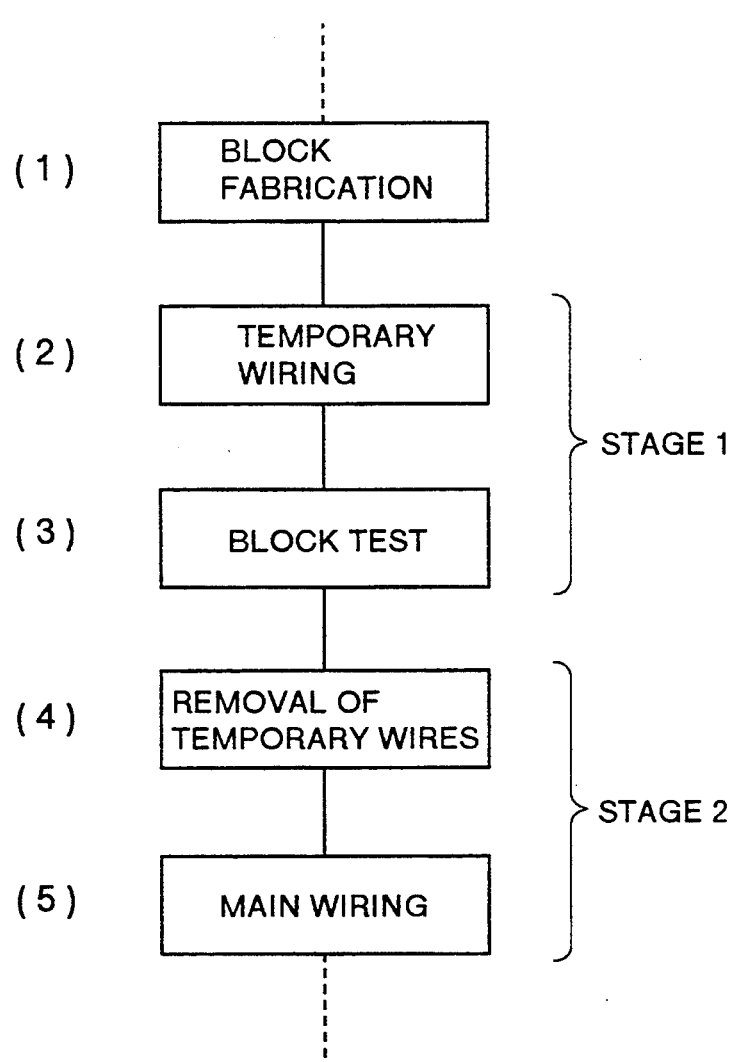
FIG. 1 is a flowchart for explaining a method of fabricating integrated circuits according to an embodiment of the present invention.

FIG. 1 is a flowchart showing the processes for fabricating integrated circuits configured of a plurality of circuit blocks according to an embodiment of the invention. This method of fabricating integrated circuits will be described below.

Process (1): A plurality of semiconductor devices such as MOS transistors constituting each circuit block are fabricated in accordance with the conventional steps of fabricating integrated circuits including photolithography, impurities diffusion and ion implantation.

Process (2): The circuit blocks are connected by temporary wirings (conductive wires in one or a plurality of layers).

Process (3): The operation test is conducted on each circuit block.

Process (4): The temporary wires are removed.

Process (5): The main wiring (conductive wires in one or a plurality of layers) is connected only to the normally-operating circuits blocks except for those circuits blocks found defective as a result of the block operation test.

The embodiment of the invention shown in FIG. 1 is different from the prior art in that the processes (2), (3) and (4) are newly added. More specifically, temporary wires are connected to conduct the operation test on each circuit block, and subsequently the temporary wires are removed. This process permits removal of defective circuit blocks, thereby improving the yield rate of the integrated circuits. The process for removing defective circuit blocks is described below.

Figure 2:
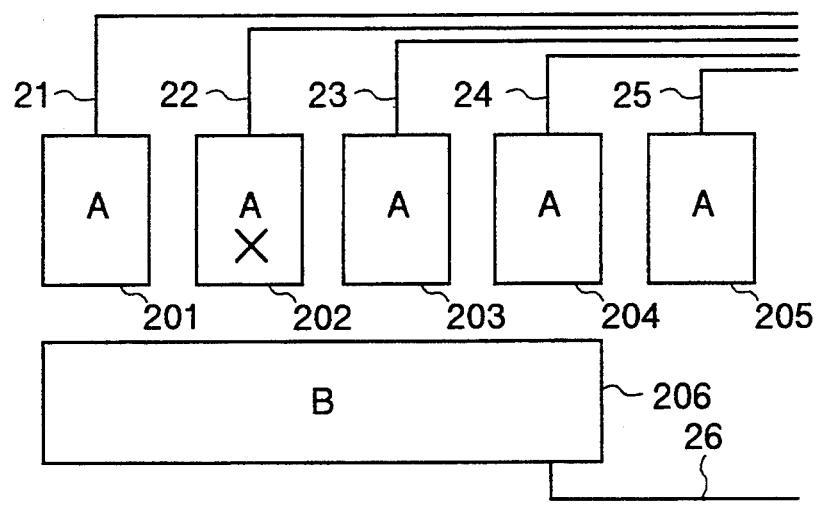
FIG. 2 is a block diagram showing the stage 1 of the method of fabricating integrated circuits according to an embodiment of the invention.
Figure 3:
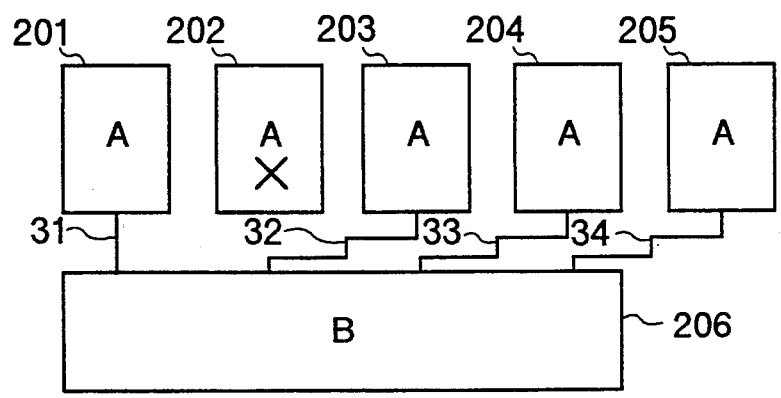
FIG. 3 is a block diagram showing step 2 of a method of fabricating integrated circuits according to an embodiment of the invention.

FIG. 2 shows the stage 1 (process (2) and process (3)) for providing temporary wires and subsequently conducting the operation test on the circuit blocks among the processes for fabricating integrated circuits shown in FIG. 1. In FIG. 2, numerals 201, 202, 203,204 designate identical circuit blocks A. A spare circuit block 205 has the same functions as the circuit blocks 201, 202, 203, 204. The diagram represents the case in which the circuit block 202 is defective. Also, numeral 206 designates a circuit block B to be connected with the circuit block A. Numerals 21, 22, 23, 24, 25, 26 designate first conductor wires constituting temporary wires, each of which is not necessarily a single wire but is normally is made of a plurality of wires. The first temporary conductor wires 21 to 26 are connected to a test device external to the chip, and the operation test is conducted on the circuit blocks 201, 202, 203, 204, 205, 206. This process determines that the circuit block 202 is defective FIG. 3 is a diagram showing the connections of the second conductor wires 31, 32, 33, 34 providing the main wires with the circuit blocks 201, 202, 203, 204, 205, 206 adapted to normally operate after total removal of the temporary wires 21 to 26 shown in FIG. 2. In FIG. 3, the blocks corresponding to those in FIG. 2 are designated by the same reference numerals as the same blocks respectively. Also, the second conductor wires 31, 32, 33, 34 are a single or a plurality of wires. The method of connecting the main wires consists in preparing five types of mask patterns to permit wiring even in the presence of a defective one of the circuits blocks 201 to 205 and selecting a mask in accordance with the result of an operation test, or directly writing one of the five patterns by the electron beam direct writing machine.

Figure 4:
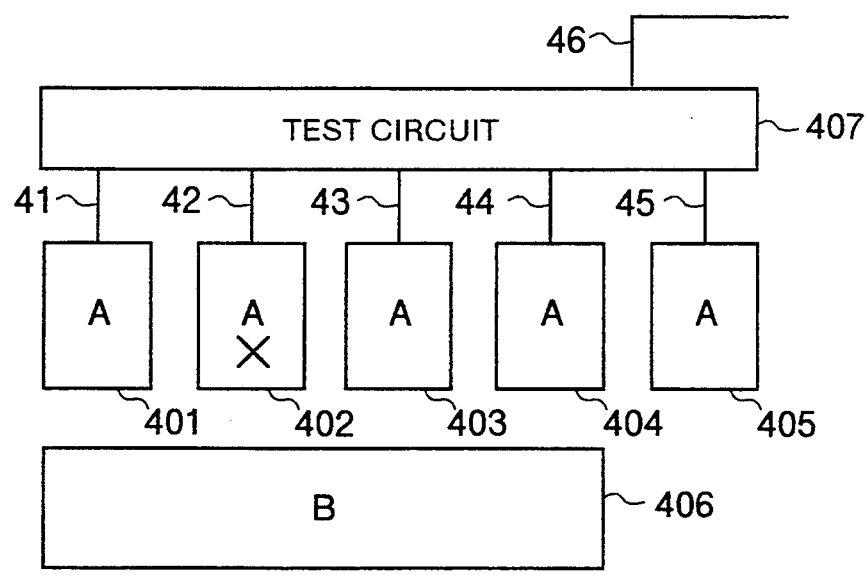
FIG. 4 is a sectional view showing temporary wirings in a method of fabricating integrated circuits according to another embodiment of the invention.

FIG. 4 shows another embodiment of the process for conducting the operation test on a circuit block among the processes for fabricating integrated circuits shown in FIG. 1. In FIG. 4, numerals 401, 402, 403, 404 designate identical circuit blocks A, and numeral 405 a spare circuit block which is similar to the circuit blocks 401 to 404. The shown embodiment represents the case in which the circuit block 402 is defective. Also, numeral 406 designates a circuit block B to be connected with the circuit block A. Numeral 407 designates a test circuit for the circuit block A. In FIG. 4, numerals 41, 42, 43, 44, 45, 46 designate first conductor wires constituting temporary wires. The wires 41 to 46 are not necessarily a single wire but may be a plurality of wires. The first conductor wires 41 to 45 connect the circuit blocks 401 to 405 to the test circuit 407 to conduct the operation test. The test result is transmitted by the first conductor wire 46 to the test unit external to the chip where the defect of the circuit 402 is detected. This embodiment with a built-in test circuit facilitates the operation test.

Figure 5:
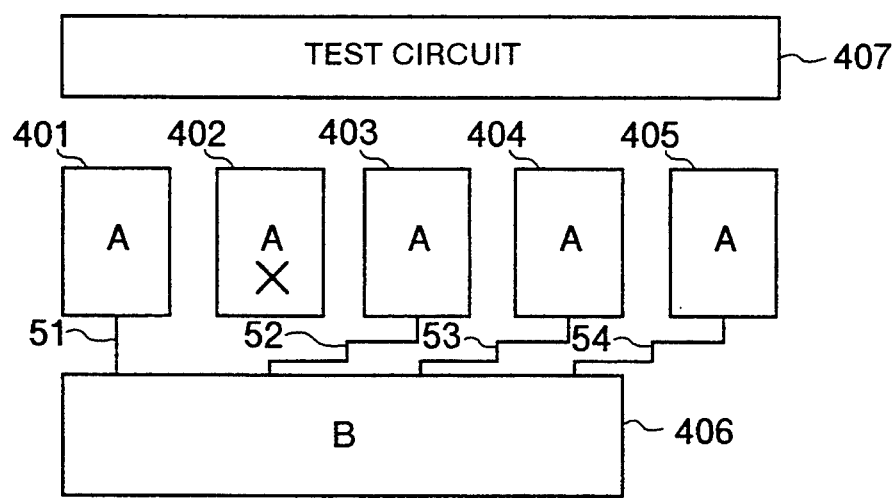
FIG. 5 is a block diagram showing the stage 2 of the method of fabricating integrated circuits according to still another embodiment of the invention.

FIG. 5 is a diagram showing the case in which the temporary wires 41, 42, 43, 44, 45, 46 shown in FIG. 4 are removed and the normally-operating circuit blocks 401, 402, 403, 404, 405, 406 are connected with the main wires 51, 52, 53, 54. In FIG. 5, numerals 401, 402, 03, 404, 405 designate identical circuit blocks A. Numeral 406 designates a circuit block B to be connected with the circuit block A, and numeral 407 a test circuit for the circuit block A. In the same diagram, numerals 51, 52, 53, 54 designate second conductor wires for the main wires, each representing a single or a plurality of wires. The method of performing this wiring consists in preparing five types of mask patterns to permit wiring even when any of the circuit blocks 401 to 405 is defective and selecting the mask in accordance with the result of the operation test, or selecting one of the five types of patterns and directly writing by an electron beam direct writing machine.

Next, the process for removing the temporary wires providing the features of a preferred embodiment of the invention will be described in detail.

FIGS. 6A, 6B are sectional views of an integrated circuit representing the process for removing the temporary wires according to an embodiment. FIG. 6A shows the state before removal of the temporary wires, and FIG.6B the state after removal thereof. A top layer's wire 61 and an intermediate layer's wire 62 make up metal wires for temporarily connecting the circuit blocks. The bottom layer's wire 63 is a metal wire electrode for connecting the semiconductor devices (n+p) in the circuit block. Numeral 64 designates an interlayer film for insulating the metal wire layers 61 and 62 for temporary wiring, and numeral 65 a semiconductor insulating surface protection film for insulating the metal wire electrode 63 of the semiconductor devices and a semiconductor substrate 66. As an example, a high-purity aluminum containing no silicon is used as a temporary wire for 61, 62, and tungsten is employed as a connective wire between the wire electrode 63 underlying the semiconductor device in the circuit block and the semiconductor device in the same circuit block. Polyimide makes up the interlayer insulating film 64, and a thermal silicon dioxide film for the semiconductor insulating surface protection film 65. By so doing, the underlying wire 63 and the semiconductor insulating surface protection film 65 can be kept intact when the temporary wires 61, 62 are removed by etching aluminum to remove the interlayer insulating film 64 (polyimide). The use of high-purity aluminum for the temporary wires 61, 62 eliminates the residual matters thereby attaining satisfactory main wiring after removal of the temporary wires.

FIGS. 7A, 7B are sectional views showing integrated circuits in the process for removing the temporary wires according to another embodiment. FIG. 7A shows the condition before removing the temporary wires, and FIG. 7B the state after removal thereof. The top layer wire 71 represents a temporary wire, numeral 72 a silicon dioxide, numeral 73 a semiconductor substrate, and numeral 74 a bottom layer's wire constituted of a conductive material for protecting the substrate in removing the temporary wire 71. The conductive material 74, which is made of a material resistive to etching in removing the temporary wire 71, makes it possible to remove the temporary wire 71 without damaging the semiconductor substrate 73 formed by the device. In the case where the temporary wire 71 is made of high-purity aluminum and the conductor 74 of titanium nitride, for example, the state shown in FIG. 7B is obtained with the conductor 74 kept intact after removal of the temporary wire 71. The main wiring of a satisfactory block thus is of course possible from the condition of FIG. 7B.

Figure 8A:
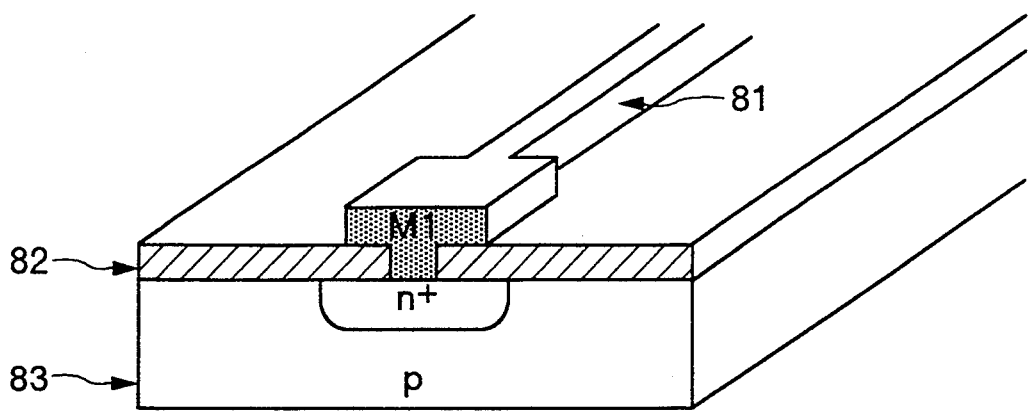
FIGS. 8A, 8B are sectional views showing the process for removing the temporary wires in the method of fabricating integrated circuits according to a further embodiment of the invention.
Figure 8B:
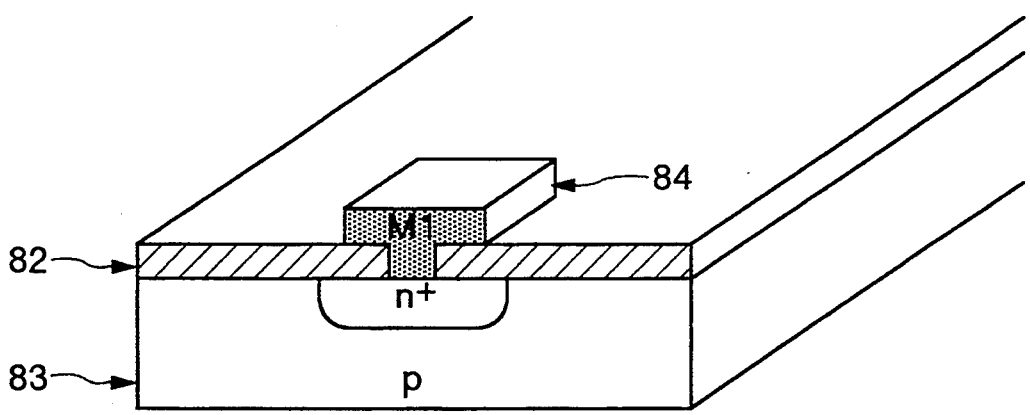

FIGS. 8A, 8B show sectional views of an integrated circuit representing another embodiment of the process for removing temporary wires. FIG. 8A shows the state before removal of temporary wires, and FIG. 8B the state after removal thereof. Numeral 81 designates a temporary wire, numeral 82 a semiconductor substrate, and numeral 84 a conductive material remaining after removal of the temporary wire 81 masking the contact between the temporary 81 and the semiconductor substrate 83. By masking the contact, the temporary wire 81 can be removed without damaging the semiconductor substrate 83. It is of course possible to connect satisfactory blocks by main wires from the state of FIG. 8B.

The above-mentioned method of fabricating integrated circuits makes it possible to remove defective circuit blocks and connect satisfactory blocks alone, thereby improving the yield rate of the integrated circuits. The improvement of the yield rate is seen from the following explanation.

Let the rejection rate per unit area be D. The yield rate Y per area a is given as $$Y = \exp(-Da)$$

When a number n of circuit blocks with area s are involved, for example, the yield rate is given as expressed below in the absence of a redundancy.

$$Y = \exp\{-D(ns)\}$$

In the case where two redundant blocks are added in the method of fabricating integrated circuits according to the invention, on the other hand, the yield rate is expressed as $$Y = \exp[-D\{(n + 2)\}] +$$

-continued
$$(n+2)C_1 \cdot \{1 - \exp(-Ds)\} \cdot \exp[-D\{(n + 1)s\}] +$$
$$(n+2)C_2 \cdot \{1 - \exp(-Ds)\}^2 \cdot \exp\{-D(ns)\}$$

In the case where $D=0.05/mm^2$, $s=mm^2$ and $n=8$, for instance, $Y=1.8\%$ according to the prior art, while $Y=17.8\%$ in the method of fabricating integrated circuits according to the invention, or an approximately ten-fold improvement in yield rate.

The method of fabricating integrated circuits according to the invention is applicable also to integrated circuits making up semiconductor storage devices, as explained below.

Figure 9:
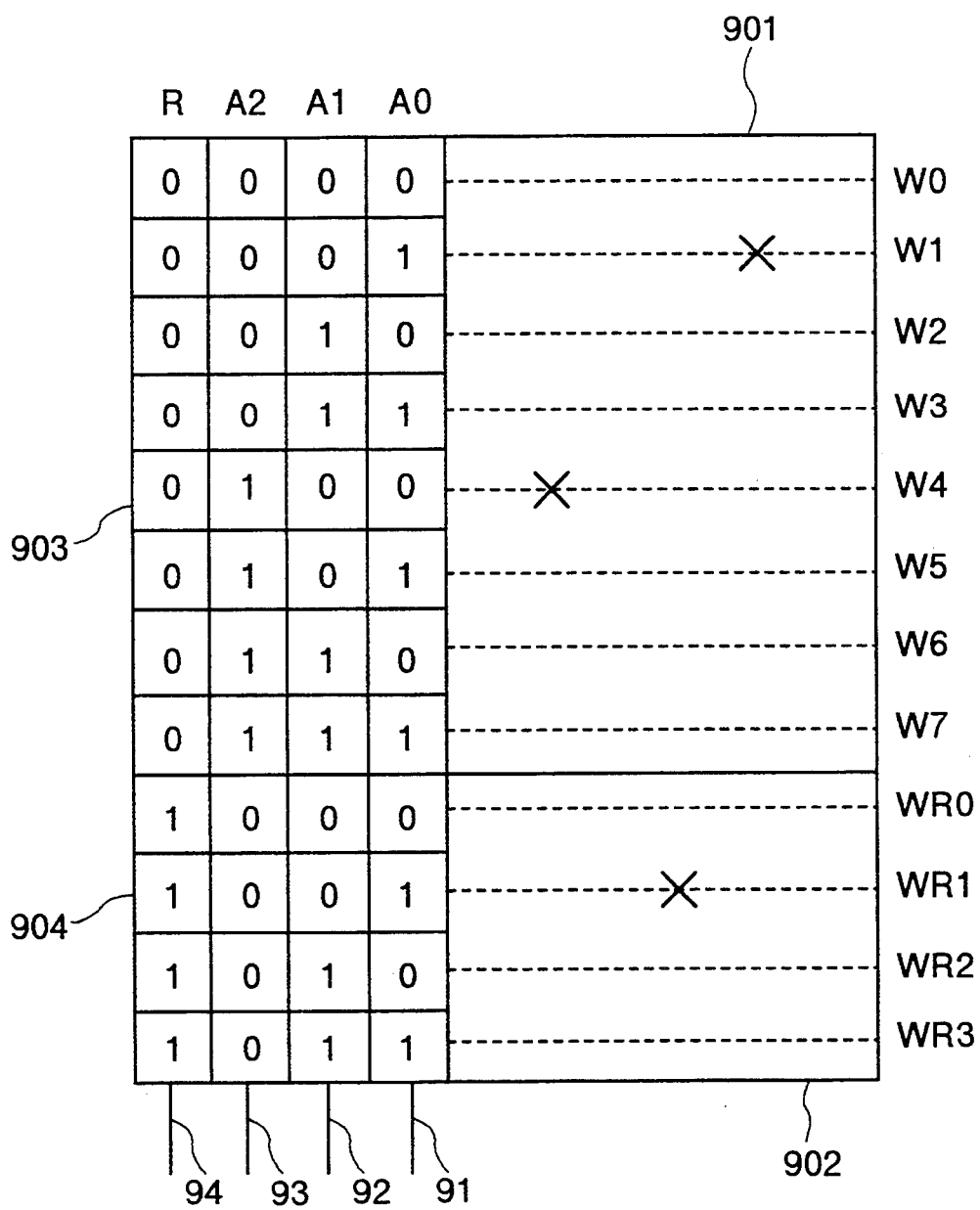
FIG. 9 is a block diagram showing the stage 1 in the method of fabricating integrated circuits according another embodiment of the invention.

FIG. 9 is a schematic diagram showing the process for conducting the operation test on a memory cell. In FIG. 9, numeral 901 designates a cell array including normal memory cells, numeral 902 a cell array including spare memory cells, numeral 903 a normal decoder circuit for selecting the word rows W0-W7 connected to the normal memory cells, numeral 904 a redundant decoder circuit for selecting the word rows WR0-WR3 connected to the redundant memory cells, and numerals 91, 92, 93, 94 address lines. The address lines 91, 92, 93 apply the normal address signals A0, A1, A2 respectively, and the address line 94 the redundant address signal R to the normal decoder circuit 903 and the redundant decoder circuit 904, respectively. In the normal decoder, the word rows W0-W7 are selected by all combinations of the normal address signals A2, A1, A0 with the redundant address signal R at "0". In the redundant decoder, the redundant word rows WR0-WR3 are selected by combinations of A1, A1, A0 in accordance with the number of redundant word rows with the redundant address signal R at "1". In this case, the word rows W1, W4, WR1 having (0001), (0100) and (1001) as the address (R, A2, A1, A0) contain a defective memory cell. The decoder circuits 903, 904 use a removable temporary wire which is connected in such a manner that all the memory-cells containing a spare memory cell can be selected by the address lines 91 to 94. The operation test conducted on the memory cell shows that the word rows W1, W4, WR1 of the addresses (0001), (0100) and (1001) have a defective memory cell.

Figure 10:
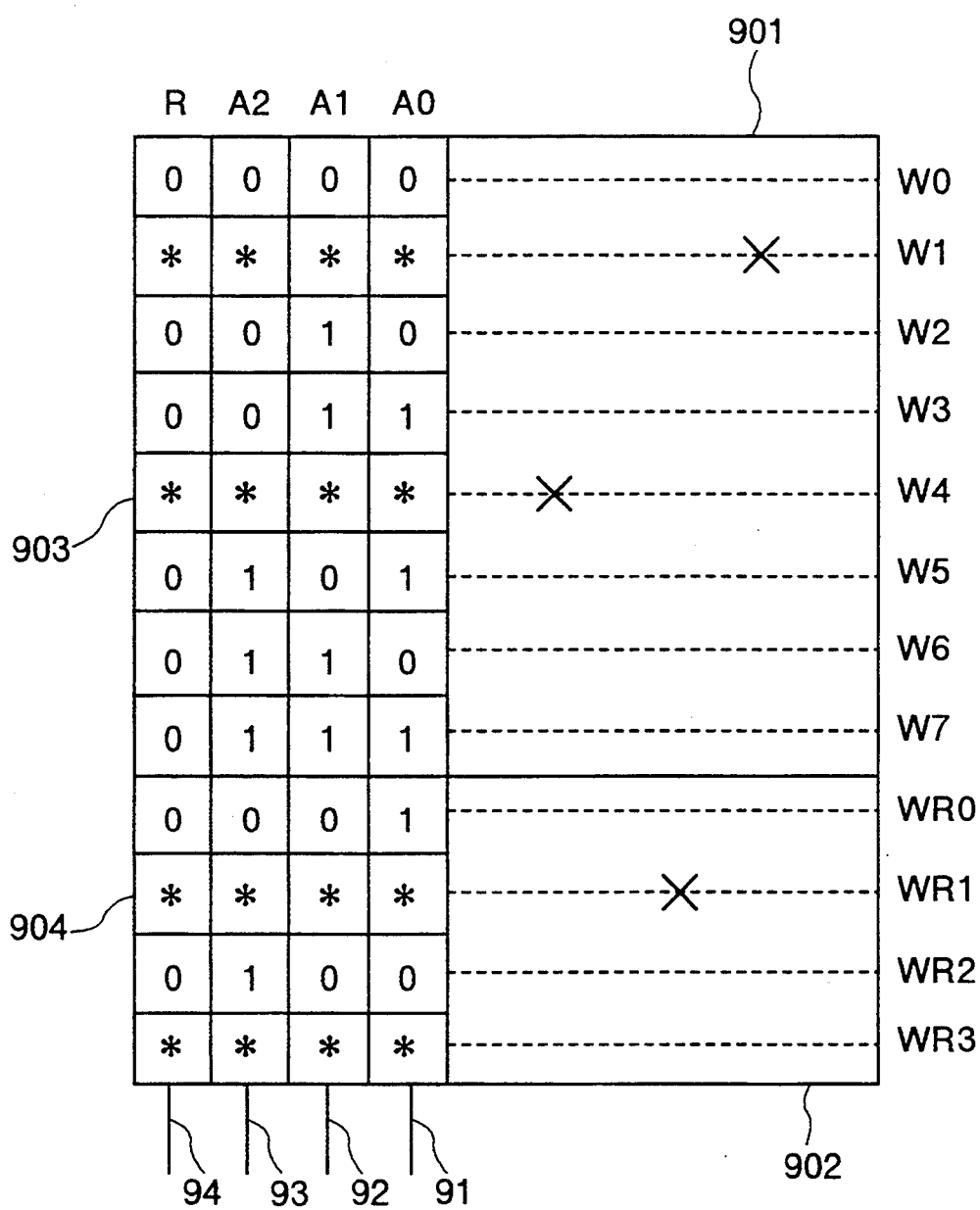
FIG. 10 is a block diagram showing the stage 2 in the method of fabricating integrated circuits according to the same embodiment of the invention.

FIG. 10 is a schematic diagram showing the process for saving a defective word row by redundancy method. The temporary wires for the decoder circuits 903, 904 are removed, and the main wire is connected in such a manner that a spare memory cell is selected without selecting the defective word rows W1, W4, WR1. More specifically, the word row W1 having a defective memory cell is replaced with the word row WR0 of the spare memory cell, and the row W4 with the word row WR2 of the spare memory cell, so that the main wire is connected in such a condition that the word row WR0 is selected for the address (0001) and the word row WR2 for the address (0100). In the process, neither the word row WR1 of the spare memory cell which has a defective memory cell nor the word row WR3 which is not necessary is used. In this wiring arrangement, the address line 94 is fixed to "0" since the redundant address signal R is not used.

As a result, defective memory cells can be eliminated from a semiconductor storage device to achieve an improved yield rate. The great advantage of the method of fabricating integrated circuits according to the present invention is that a program circuit is not required for replacing a defective word line with a spare word line, while at the same time preventing the redundancy from increasing access time.

Although the embodiment under consideration concerns a method of redundancy by word row in the presence of memory cell defects, a redundancy method by bit row is also applicable with equal effect.

The method of fabricating integrated circuits according to the invention is also applicable to gate array integrated circuits, as explained below.

Figure 11:
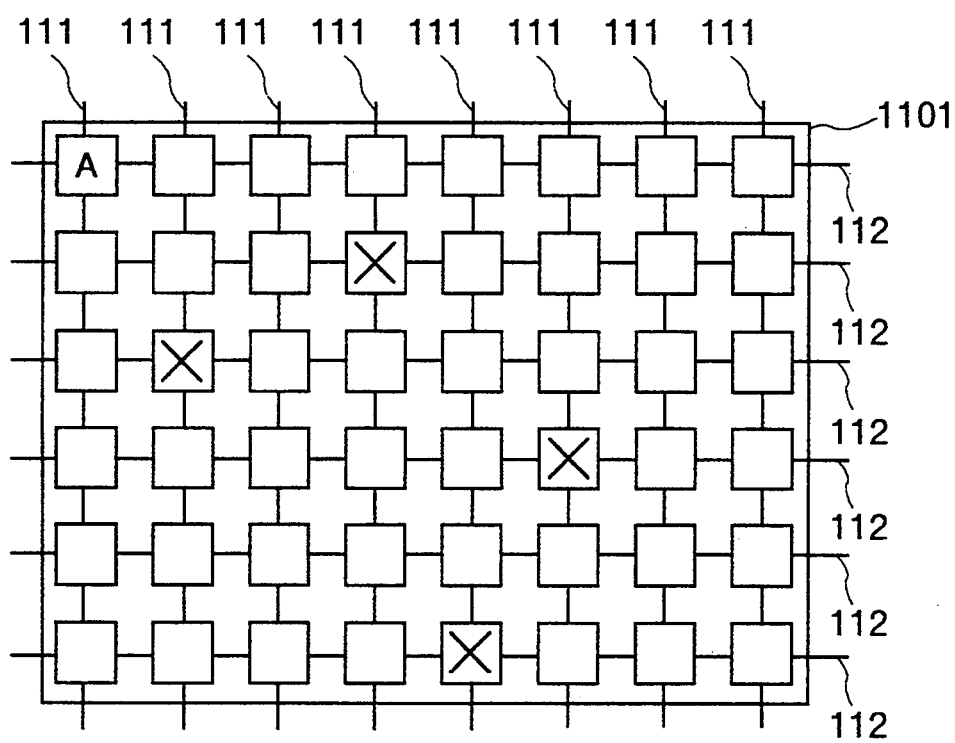
FIG. 11 is a block diagram showing the stage 1 in the method of fabricating integrated circuits according to still another embodiment of the invention.

FIG. 11 shows the stage for conducting the operation test on a gate array with temporary wires. In FIG. 11, character A designates a block having one or a plurality of gates, numeral 1101 a gate array having one or a plurality of blocks A, and numerals 111, 112 externally-connected removable temporary wires making up conductor wires which have different layers. Defective gates are identified by switching the signals of the conductor wires 111, 112 and conducting the operation test while scanning the gate array.

Figure 12:
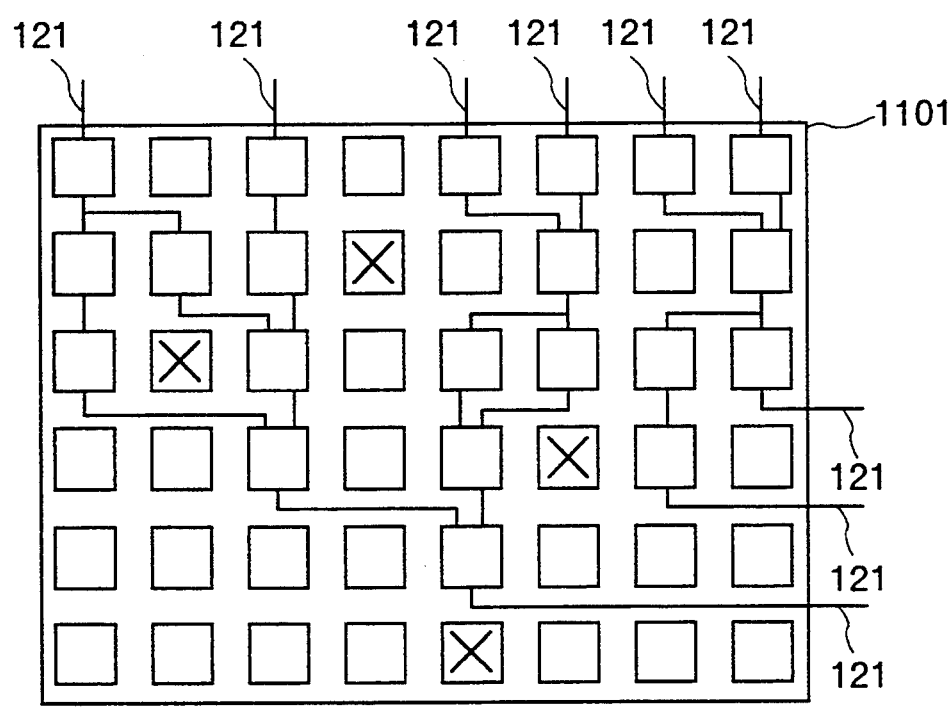
FIG. 12 is a block diagram showing step 2 in the method of fabricating integrated circuits according to the same embodiment of the invention.

FIG. 12 is a diagram showing the main wiring of normally-operating blocks from which the temporary wires for the operation test are removed. In FIG. 12, numeral 1101 designates a gate array and numeral 121 main wires. With the main wires, defective blocks are removed and normal blocks connected by direct writing the electron beam direct writing machine in accordance with the result of the gate array operation test.

Figure 13:
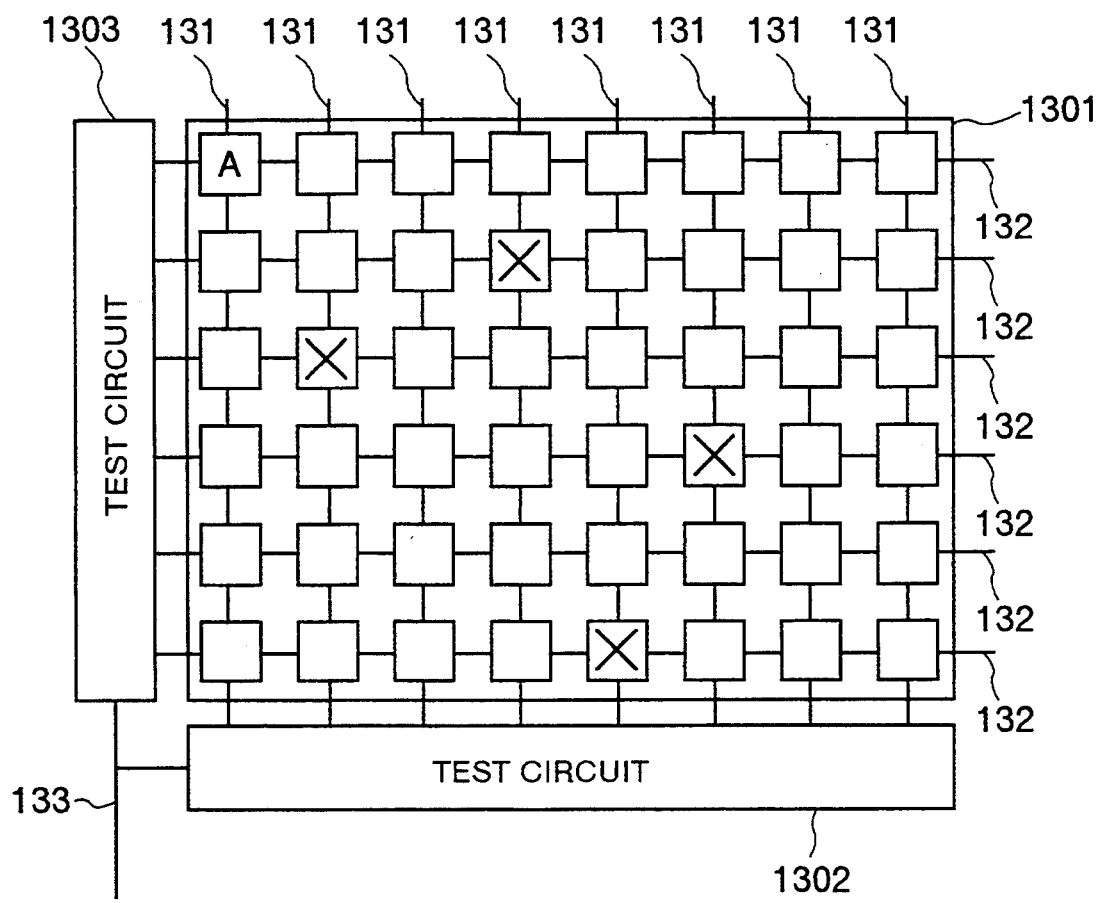
FIG. 13 is a block diagram showing the stage 1 in the method of fabricating integrated circuits according to a further embodiment of the invention.

FIG. 13 shows the stage for conducting a gate array test with temporary wires according to another embodiment. In FIG. 13, character A designates a block including one or a plurality of gates, numeral 1301 a gate array including one or a plurality of blocks A, numerals 1302, 1303 gate array test circuits, and numerals 131, 132, 133 conductor wires making up removable temporary wires. The test is conducted while scanning the gate array by the test circuits 1302, 1303 thereby to identify defective gates.

Figure 14:
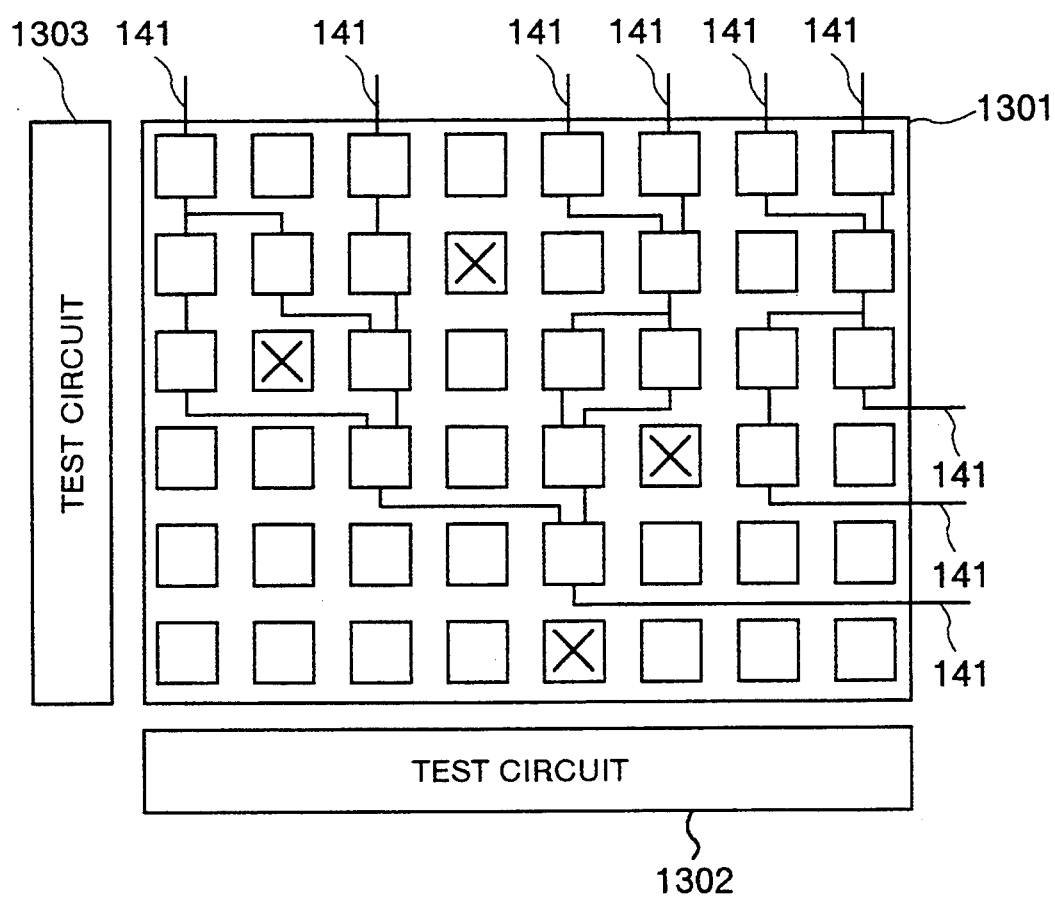
FIG. 14 is a block diagram showing the stage 2 in the method of fabricating integrated circuits according to the same embodiment of the invention.

FIG. 14 is a diagram showing normally operating blocks connected by main wires with the temporary wires for the test removed. In FIG. 14, numeral 1301 designates a gate array, numerals 1302, 1303 gate array test circuits, and numeral 141 main wires. In the main wiring setup, defective blocks are removed with normal blocks connected by direct writing using the electron beam direct writing machine in accordance with the result of the gate array test.

Figure 15:
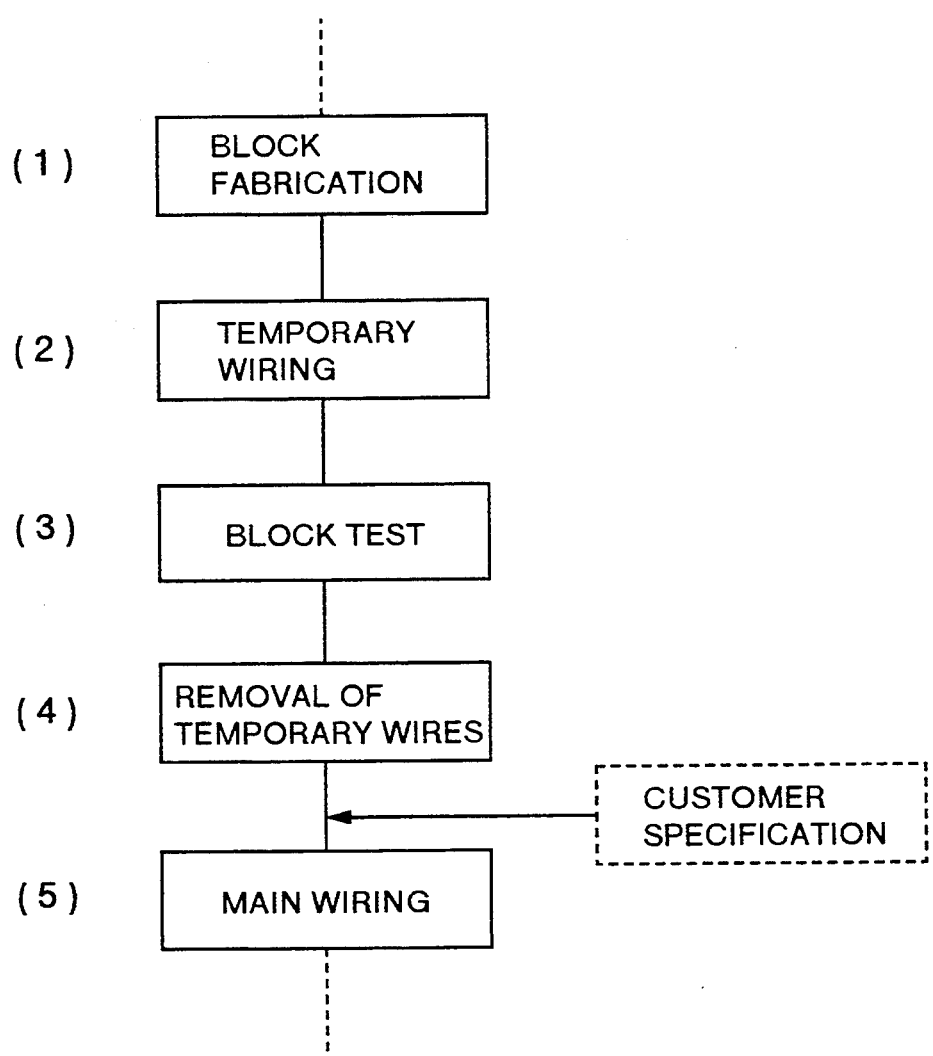
FIG. 15 is a flowchart for explaining the method of fabricating integrated circuits according to an embodiment of the invention.

FIG. 15 is a flowchart for explaining the method of fabricating integrated circuits in which blocks are connected in accordance with the customer specification. The feature of this method of fabricating integrated circuits resides in that the fabrication processes are suspended to preserve the chip with the temporary wires removed after the block fabrication, the temporary wiring for block test and the block test, and required blocks are connected by main wires in accordance with the customer specification. Since the chip has been completely subjected to the block test, there is no need of in-block test after acceptance of the customer specification, thereby remarkably shortening the development lead time.

Figure 16A:
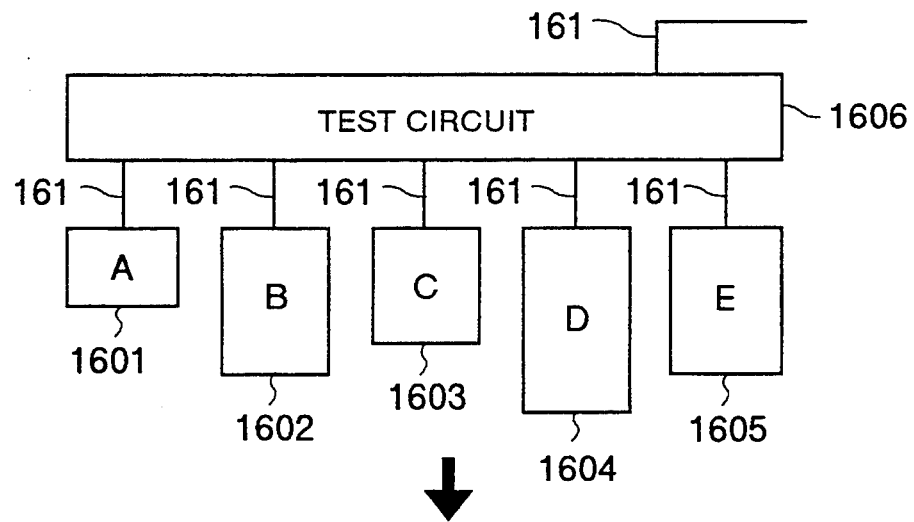
FIGS. 16A, 16B, 16C are block diagrams showing the method of fabricating integrated circuits according to an embodiment of the invention.
Figure 16B:
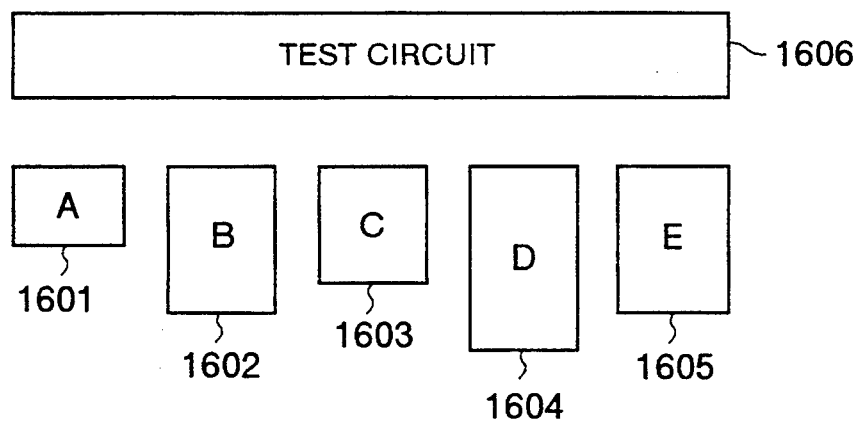
Figure 16C:
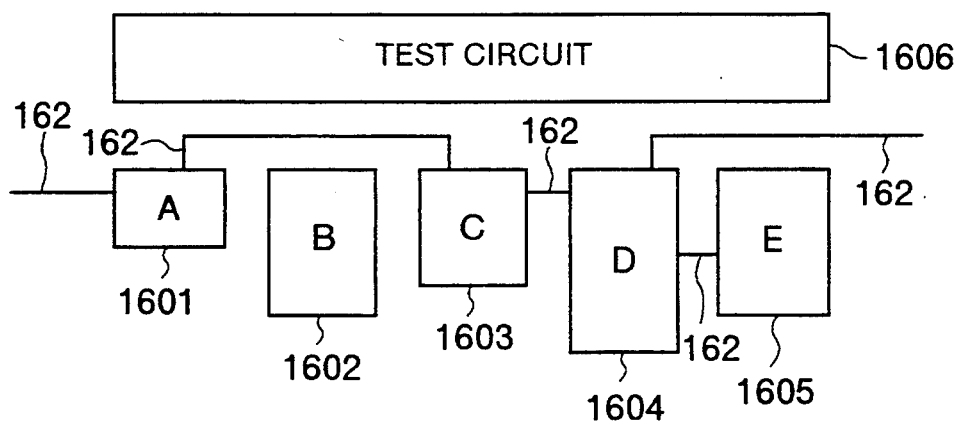

FIGS. 16A to 16C show block diagrams showing a method of fabricating integrated circuits in which blocks are connected in accordance with the customer specification. In FIGS. 16A to 16C, numerals 1601, 1602, 1603, 1604, 1605 designate blocks having certain functions which may or may not be different from each other. Numeral 1606 designates a test circuit for testing each block. Numeral 161 designates temporary wires for testing the blocks, and numeral 162 main wires. After acceptance of the customer specification, the intended integrated circuits can be fabricated simply by wiring the blocks that have been subjected to the block test from the state described in FIG. 16B, and therefore the lead time before successful development can be reduced considerably.

As described above, as far as the chip is preserved while the conductive wires connected for the block test are removed after the block test, all that is required for subsequent processes is to connect the necessary blocks in accordance with the customer specification, resulting in a considerably reduced development lead time.

It will thus be understood from the foregoing description that according to the present invention, defective blocks can be removed without any redundancy circuit for replacing defective blocks with conforming spare blocks. As a result, the yield rate of integrated circuits is improved without increasing the circuit size or the operation delay time for redundancy.

We claim:

1. A method of fabricating semiconductor integrated circuits, comprising the steps of:
   (a) forming a semiconductor device, constituting circuit blocks, in a semiconductor substrate, and thereafter forming an insulating surface protection film with a via on said semiconductor device;
   (b) connecting an electrode to said semiconductor device through said via of said insulating ,surface protection film;
   (c) forming a layer insulating film made of a material different from said insulating surface protection film and having a via on said electrode and said insulating surface protection film;
   (d) after steps (a), (b) and (c), connecting at least a first conductor wire to a plurality of said circuit blocks and testing said circuit blocks thereby to discriminate normal circuit blocks from defective circuit blocks, wherein said first conductor wire is connected to said electrode through said via of said layer insulating film;
   (e) removing said first conductor wire both from defective circuit blocks and from normal circuit blocks; and
   (f) forming at least a second conductor wire for interconnecting said normal circuit blocks, wherein said layer insulating film is removed before said second conductor wire is formed.

2. A method of fabricating semiconductor integrated circuits according to claim 1,
   wherein the material of said first conductor wire is different from that of said electrode of said semiconductor device.

3. A method of fabricating semiconductor integrated circuits according to claim 2,
   wherein said first conductor wire removed is made of a conductive material comprising one of aluminum, tungsten and copper as the main component thereof.

4. A method of fabricating semiconductor integrated circuits, comprising steps of:
   forming, on a semiconductor substrate, semiconductor elements constituting a plurality of circuit blocks;
   forming a first insulating film, with openings over said semiconductor elements, for surface protection;
   forming wiring electrodes on said semiconductor elements through said openings;
   forming a second insulating film, with openings over said wiring electrodes, for insulation between layers;
   connecting said plurality of circuit blocks by connecting first conductor wires with said wiring electrodes through said openings of said second insulating film;
   discriminating normal circuit blocks from defective circuit blocks among said plurality of circuit blocks by performing tests regarding said plurality of circuit blocks;
   removing said first conductor wires and said second insulating film; and
   forming second conductor wires for mutually connecting said normal circuit blocks,
   wherein materials of said first conductor wires are different from materials of said wiring electrodes, and materials of said second insulating film are different from materials of said first insulating film.

5. A method of fabricating semiconductor integrated circuits according to claim 4,
   wherein said first conductor wire removed is made of high-purity aluminum.

6. A method of fabricating semiconductor integrated circuits according to claim 4,
   wherein said second insulating film is made of a material having a heat resistance of 200° C. and an impurities content of not more than 100 ppm.

7. A method of fabricating semiconductor integrated circuits according to claim 6,
   wherein said layer insulating film is made of polyimide.

8. A method of fabricating semiconductor integrated circuits according to claim 5, wherein said wiring electrodes are made of tungsten.

9. A method of fabricating semiconductor integrated circuits according to claim 7, wherein the insulating surface protection film is made of $SiO_2$.

10. A method of fabricating semiconductor integrated circuits according to claim 9, wherein said first conductor wires are made of high-purity aluminum.

11. A method of fabricating semiconductor integrated circuits according to claim 10, wherein wiring electrodes are made of tungsten.

12. A method of fabricating semiconductor integrated circuits, comprising steps of:
    providing a semiconductor substrate having a plurality of semiconductor elements, the semiconductor elements constituting a plurality of circuit blocks, the semiconductor substrate having a first insulating film thereover, the first insulating film having openings therethrough, with wiring electrodes provided on the first insulating film and contacting the semiconductor elements via said openings, the wiring electrodes having a second insulating film thereover, the second insulating film being made of a different insulating material than that of the first insulating film;
    forming a first conductor wire electrically connected to the wiring electrodes via holes through said second insulating film;
    testing the plurality of circuit blocks using the first conductor wire, to discriminate normal circuit blocks from defective circuit blocks;
    removing the first conductor wire and the second insulating film; and forming a second conductor wire for interconnecting the normal circuit blocks.

13. A method of fabricating semiconductor integrated circuits according to claim 12, wherein the first conductor wire and the wiring electrodes are made of different materials.

14. A method of fabricating semiconductor integrated circuits according to claim 12, wherein the first insulating film is made of $SiO_2$.

15. A method of fabricating semiconductor integrated circuits according to claim 14, wherein the second insulating film is made of a polyimide.

16. A method of fabricating semiconductor integrated circuits according to claim 12, wherein the first conductor wire is made of a material that includes one of aluminum, tungsten and copper as a main component thereof.

17. A method of fabricating semiconductor integrated circuits, comprising:
the first step of connecting at least a first conductor wire to a plurality of circuit blocks and testing said circuit blocks thereby to discriminate normal circuit blocks from defective circuit blocks, wherein said first conductor wire is electrically connected to wiring electrodes of semiconductor elements of the semiconductor integrated circuits, a first insulating film being provided between the wiring electrodes and first conductor wire;
the second step of removing said first conductor wire both from defective circuit blocks and from normal circuit blocks; and
the third step of removing the first insulating film; and
after the third step of removing the first insulating film, the fourth step of forming at least a second conductor wire for interconnecting said normal circuit blocks.

18. A method of fabricating semiconductor integrated circuits according to claim 17, wherein the first conductor wire is removed from all of the defective and normal circuit blocks, the first conductor wire being a temporary wire.

19. A method of fabricating semiconductor integrated circuits according to claim 18, wherein the first conductor wire is connected from the plurality of circuit blocks to a test circuit.

20. A method of fabricating semiconductor integrated circuits according to claim 19, wherein the second conductor wire is connected from the normal circuit blocks to a circuit block different than the test circuit.

21. A method of fabricating semiconductor integrated circuits according to claim 17, wherein the first conductor wire is connected from the plurality of circuit blocks to a test circuit.

22. A method of fabricating semiconductor integrated circuits according to claim 21, wherein the second conductor wire is connected from the normal circuit blocks to a circuit block different than the test circuit.

23. A method of fabricating semiconductor integrated circuits according to claim 17, wherein the wiring electrodes are on a second insulating film on the semiconductor elements, the first and second insulating films being formed of different insulating materials.

24. A method of fabricating semiconductor integrated circuits according to claim 17, wherein the first conductor wire and the wiring electrodes are made of different materials.

25. A method of fabricating semiconductor integrated circuits according to claim 17, wherein said first conductor wire is electrically connected to semiconductor elements of the semiconductor integrated circuits, wherein the method includes the further step of forming a layer of electrically conductive material on the semiconductor elements prior to forming the first conductor wire, the first conductor wire being electrically connected to the semiconductor elements via said layer, and wherein in removing the first conductor wire said layer is left so as to protect the semiconductor elements when removing the first conductor wire.

* * * * *